United States Patent
Larky et al.

(10) Patent No.: US 6,857,088 B1
(45) Date of Patent: Feb. 15, 2005

(54) METHOD AND SYSTEM FOR TESTING THE LOGIC OF A COMPLEX DIGITAL CIRCUIT CONTAINING EMBEDDED MEMORY ARRAYS

(75) Inventors: Steven P. Larky, Del Mar, CA (US); Michael L. Lewis, Escondido, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 426 days.

(21) Appl. No.: 09/732,487

(22) Filed: Dec. 6, 2000

(51) Int. Cl.$^7$ .............................................. G01R 31/28
(52) U.S. Cl. ....................................................... 714/719
(58) Field of Search ................................ 714/718, 724, 714/726, 738, 719; 365/200, 201; 326/16; 324/73.1

(56) References Cited

U.S. PATENT DOCUMENTS

| | | | | |
|---|---|---|---|---|
| 3,961,251 A | * | 6/1976 | Hurley et al. | 714/718 |
| 5,553,082 A | * | 9/1996 | Connor et al. | 714/736 |
| 5,987,635 A | * | 11/1999 | Kishi et al. | 714/724 |
| 5,991,907 A | * | 11/1999 | Stroud et al. | 714/725 |
| 6,202,182 B1 | * | 3/2001 | Abramovici et al. | 714/725 |
| 6,553,525 B1 | * | 4/2003 | Shephard, III | 714/733 |

\* cited by examiner

*Primary Examiner*—Shelly A Chase
(74) *Attorney, Agent, or Firm*—Wagner, Murabito & Hao LLP

(57) ABSTRACT

A method and system for testing the logic of a complex digital circuit containing embedded memory arrays. One embodiment provides for a process which first creates a model for the memory array in the circuit. Next, the memory array is loaded with values representing the model. For example, the memory array may be modeled as a wire by loading each memory location with its address. In this fashion, the data output of the memory array will be equal to the input address. Next a test pattern is generated, based upon the model of the memory array. The memory array is prevented from being written while the test pattern is scanned into the circuit. In this fashion, the output of the memory array is predictable and the output of the circuit may be monitored to determine if the combinational logic has any defects.

18 Claims, 9 Drawing Sheets

METHOD AND SYSTEM FOR TESTING THE LOGIC OF A COMPLEX DIGITAL CIRCUIT CONTAINING EMBEDDED MEMORY ARRAYS

FIELD OF THE INVENTION

The present invention relates to the field of testing logical circuitry. Specifically, the present invention relates to a method for testing the combinational logic in a circuit also containing random access memory.

BACKGROUND ART

Newly manufactured digital circuits require testing of the combinational logic. One conventional testing technique is to generate a number of scan vectors and input them to the circuit. After passing through the circuit, the values are sampled and compared with expected results, based upon the configuration of the combinational logic. An automatic test pattern generation (ATPG) tool may be used to assist the process. However, if the circuit contains random access memory (RAM), the testing process is complicated. For example, some combinational logic may feed the various inputs to the RAM and the output of the RAM may feed more combinational logic. Unfortunately, the output of the RAM during this testing process is extremely difficult to predict. Consequently, it is very difficult to test the combinational logic that feeds or is fed by the RAM.

One conventional method of such testing provides for cases resulting in unknown values. For example, if RAM negatively impacted testing, the expected value at the output of the circuit will be indeterminate. Otherwise, a definite one or zero is expected. Accounting for the unknown case requires a doubling of the amount of memory in the ATPG tool. Consequently, this greatly increases testing costs. Additionally, the combinational logic along the unknown path is untested. Furthermore, some conventional testing tools do not allow for unknown states. Other testing tools may allow for unknown states when a limited number of test vectors are used, for example, 256,000. However, if more test vectors are used, the tool is unable to handle unknown values.

Another conventional method of testing combinational logic when RAM is present is a partial scan method, which eliminates from the scan chain the combinational logic that the RAM output feeds. Unfortunately, this method decreases the ability to detect manufacturing defects. Consequently, this reduces the quality of the parts shipped.

Another conventional testing method places a series of multiplexers before each RAM, which allow bypassing the RAMs when in testing mode. This method may lead to covering combinational logic that feeds and is fed by the RAMs. However, the additional multiplexers add significantly to the cost per part by adding to the die level resources. Furthermore, during non-test operation the signal must still pass through the added multiplexers to get to the RAMs. Therefore, this may delay the critical path if the RAM to read data is the longest path in the circuit.

SUMMARY OF THE INVENTION

Therefore, it would be advantageous to provide a method for testing combinational logic in a digital circuit containing RAM. A further need exists for such a method that uses memory within a testing tool efficiently. A still further need exists for a method that covers substantially all combinational logic within the circuit. An even further need exists for such a method that uses scarce space on the circuit efficiently, by not requiring substantial testing circuitry to be added. An even further need exists for such a method that does not substantially impair the performance of the circuit when testing is not underway, for example, by not causing a delay along the critical path in the circuitry.

The present invention provides a method for testing combinational logic in a circuit containing RAM. Embodiments provide for such a method that uses memory within a testing tool efficiently. Embodiments provide for such a method that covers substantially all combinational logic within the circuit. Embodiments provide for such a method that uses scarce space on the circuit efficiently, by not requiring substantial testing circuitry to be added. Embodiments provide for such a method that does not substantially impair the performance of the circuit when testing is not underway, for ex ample, by not causing a delay along the critical path in the circuitry. The present invention provides these advantages and others not specifically mentioned above but described in the sections to follow.

A method and system for testing the logic of a complex digital circuit containing embedded memory arrays is disclosed. One embodiment of the present invention provides for a process of testing the logic of a complex digital circuit containing embedded memory arrays. The first step of the process is creating a model for the memory array in the circuit. Next, the memory array is loaded with values representing the model. For example, the memory array may be modeled as a wire by loading each memory location with its address. In this fashion, the data output of the memory array will be equal to the input address. The next step is generating a test pattern for the circuit, based upon the model of the memory array. For example, the model of the memory array may be fed into a test pattern generation tool to accomplish this step. The memory array is prevented from being written during testing of the logic of the circuit. Next, the test pattern is scanned into the circuit. In this fashion, the output of the memory array is predictable and the output of the circuit may be monitored to determine if the combinational logic has any defects. In other embodiments, the memory array is modeled as a lookup table.

In still another embodiment, the values loaded into the memory array are changed and the circuit is re-tested. In one embodiment, the process determines if a particular fault is repeatedly occurring in numerous parts. If so, the values loaded into the memory array are chosen to increase the likelihood of finding such flaws.

Yet another embodiment provides for a system for testing a complex digital circuit. The system contains the circuit under test, which comprises combinational logic and a memory array. The circuit also has control logic that prevents the memory array from being written and allows the memory to be read. The control logic is externally controllable. Additional logic allows the memory array to be loaded with data external to the circuit, based on addresses input to the circuit. Alternatively, this logic may automatically load into the memory array known values when the circuit is powered up. The system also has logic for determining values to load into the memory. Furthermore, the system has logic to generate a test pattern based upon the combinational logic and the values to be loaded in the memory. For example, a test pattern generator tool is used.

DETAILED DESCRIPTION OF THE INVENTION

Figure 1A:
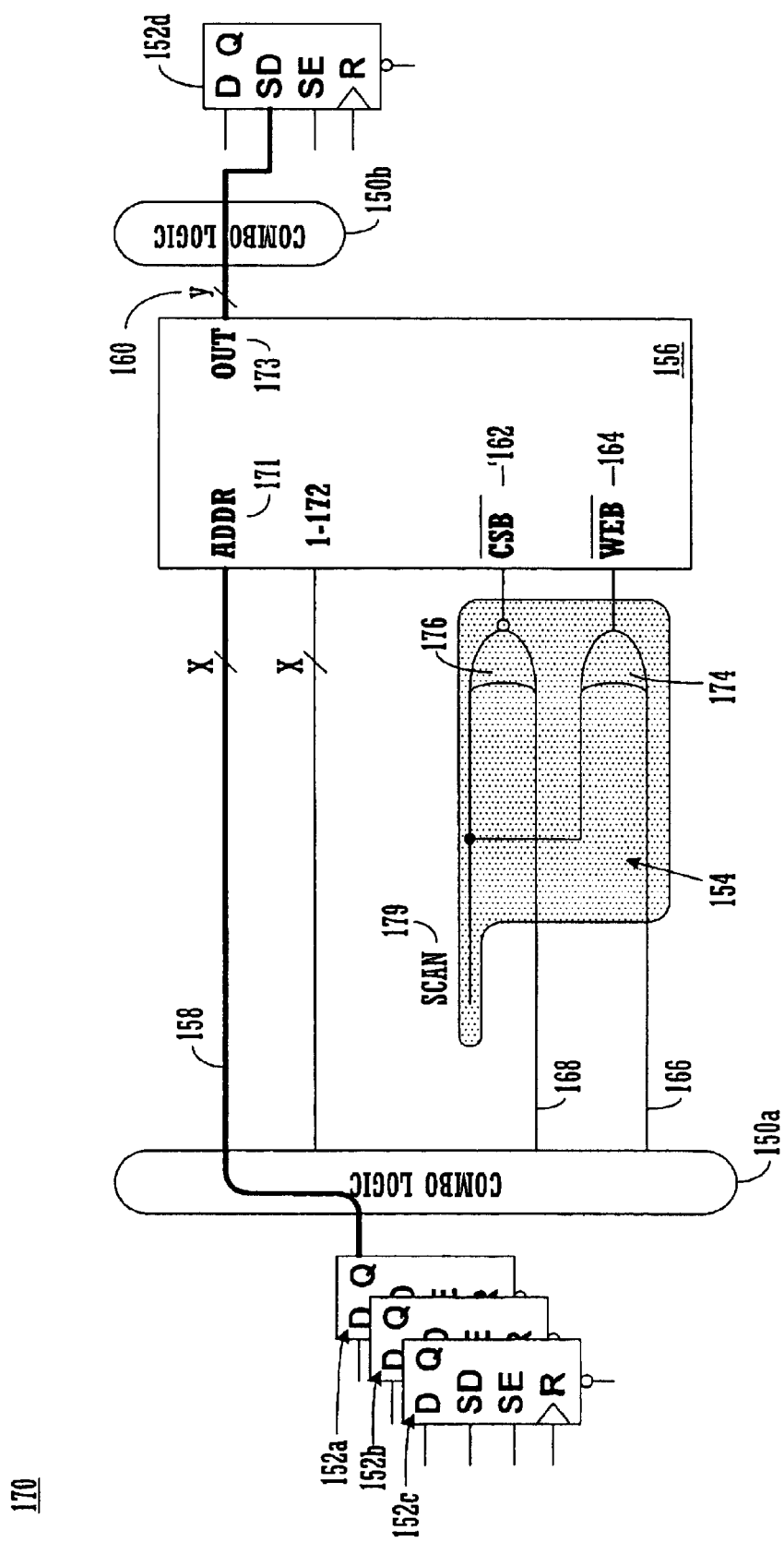
FIG. 1A is a block diagram illustrating improved test coverage of a circuit to be tested containing combinational logic and random access memory, according to an embodiment of the present invention.

In the following detailed description of the present invention, a method and system for testing the logic of a complex digital circuit containing embedded memory arrays, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

A METHOD AND SYSTEM FOR TESTING THE LOGIC OF A COMPLEX DIGITAL CIRCUIT CONTAINING EMBEDDED MEMORY ARRAYS

The present invention provides for a method and system for testing the logic of a complex digital circuit containing embedded memory arrays. Rather than bypassing the memory arrays, embodiments of the present invention use the memory arrays in the testing of the combinational logic. Embodiments of the present invention pre-load known values into a memory array. Then, the memory array is prevented from accepting new values and the circuit tested. Various embodiments strategically load the memory arrays to make it easier to model the circuit under test and to increase the probability of detected manufacturing defects. FIG. 1 illustrates a circuit 170 containing combinational logic 150a to be tested with outputs to the address input 171 of the memory array 156. The data output 173 of the memory array 156 connects to more combinational logic 150b. In one embodiment, a test vector is scanned into the circuit 170 and the output is monitored to test the combinational logic 150.

The circuit 170 also contains control circuitry 154 (e.g., design for test (DFT) circuitry) which connects to the write enable 164 and the memory array select 162 of the memory array 156. Without the control circuitry 154, the output of the memory array 156 would be indeterminate during testing of the circuit 170 because of the difficulty in predicting the data hold times, etc., for the data input 172 and the write enable 164 and the memory array select 162. However, the control circuitry 154 allows the prevention of writing to the memory array 156 while testing is underway.

Embodiments allow testing of combinational logic 150 that is missed by some conventional methods. For example, the combinational logic 150a feeding address path 158 is logic which is testable by embodiments of the present invention. Additionally, the combinational logic 150b that is fed by the output 173 of the memory array 156 is also testable.

In the embodiment of FIG. 1A, the control circuit 150 functions as follows. When pre-loading the memory array 156, the write enable 164 is kept low by keeping the scan line 179 and line 166 low so that writing is able to take place. The control flip-flop 152c allows the write enable 164 to be kept low by allowing control over line 166. Data is input to the memory array 156 via the input data flip-flop 152b. The address is input via the address flip-flop 152a. During testing, the contents of the memory array 156 is prevented from changing regardless of how the combinational logic 150a affects line 166 by holding the scan line 179 high, and thus disabling writing. Additionally, the scan line 179 keeps the chip select 162 low so that the contents of the data corresponding to the address input 172 to the memory array 156 is always output. It will be understood that the function of pre-loading the memory array 156 and of keeping the array 156 from being written may be accomplished in any suitable fashion. For example, the OR 174 and the NOR gate 176 may be thought of as conceptual gates whose function could be implemented with circuitry inside of the memory array 156 or elsewhere. It will be understood that the complex digital circuit 170 may contain numerous memory arrays 156, which may be for example random access memory (RAM).

Figure 1B:
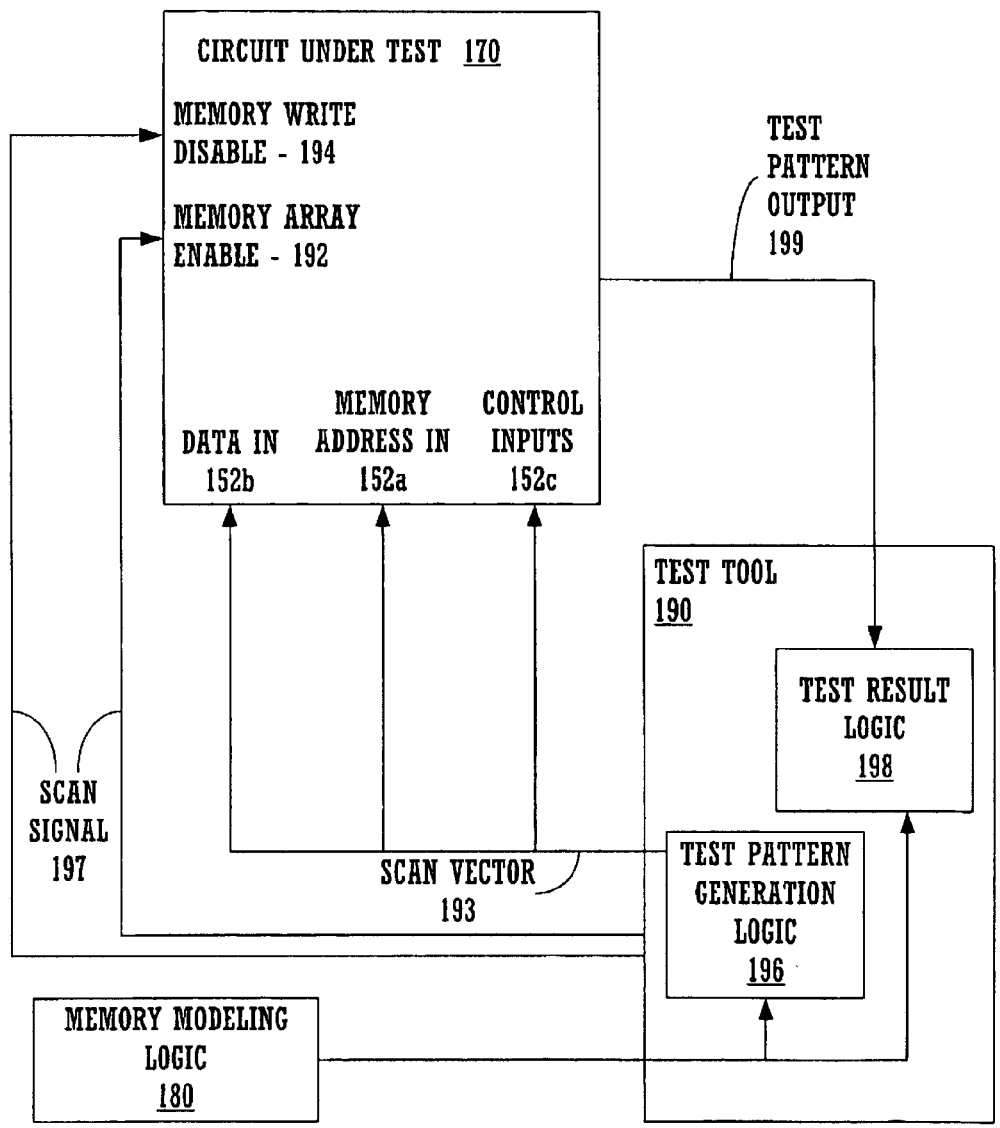
FIG. 1B is a block diagram of a system for testing a complex digital part containing, embedded RAM, according to an embodiment of the present invention.

Referring now to FIG. 1B, one embodiment provides for a system 182 for testing a complex digital circuit 170. The circuit 170 has an input for memory data 152b and input for memory addresses 152a. However, the present invention is not limited to loading the memory arrays 156 via an external source. In one embodiment, the memory arrays 156 automatically load in a known values when the circuit 170 is powered up. Furthermore, there is an input 194 to prevent writing to memory arrays 156 in the circuit 170 regardless of what is input to the write enable 164 of the memory array 156 from the combinational logic 150 under test. This feature may be accomplished in numerous ways, for example, the control circuitry 154 of FIG. 1A may be used.

The circuit 170 also has a memory array enable input 192, which allows external control over the output 160 of the memory arrays 156 regardless of what signal the combinational logic 150 under test feeds to the enable 162 of the memory array 156. In practice, both inputs (192, 194) may be controlled by a single line, for example, a test mode or scan mode input.

Still referring to FIG. 1B, memory modeling logic 180 determines the values to be loaded at each memory address. This information is provided to the test tool 190, which uses it to generate a test pattern 193 (e.g., using test pattern generation logic 196). The test tool 190 may be an automatic test pattern generation (ATPG) tool. Such tools are readily available from many vendors. In one embodiment, the test tool 190 loads the data modeling the arrays 156 into the memory arrays 156 and then prevents the memory arrays 156 from being written by exerting a scan signal 197 to the memory write disable 194.

The test tool 190 monitors the output 199 of the circuit under test 170 to determine whether the combinational logic 150 is functioning properly (e.g., using test result logic 198). In one embodiment, the memory arrays 156 are modeled as wires. In this fashion, the test tool 190 may easily incorporate the memory arrays 156 into its process. However, the present invention is not limited to modeling the memory arrays 156 as wires. For example, in one embodiment, the memory arrays 156 are modeled as lookup tables. The function of the lookup table is given to the test tool 190, which uses this to determine an appropriate test pattern (test vector), as well as to determine the expected results of the test based on the combinational logic 150 configuration.

Figure 2A:
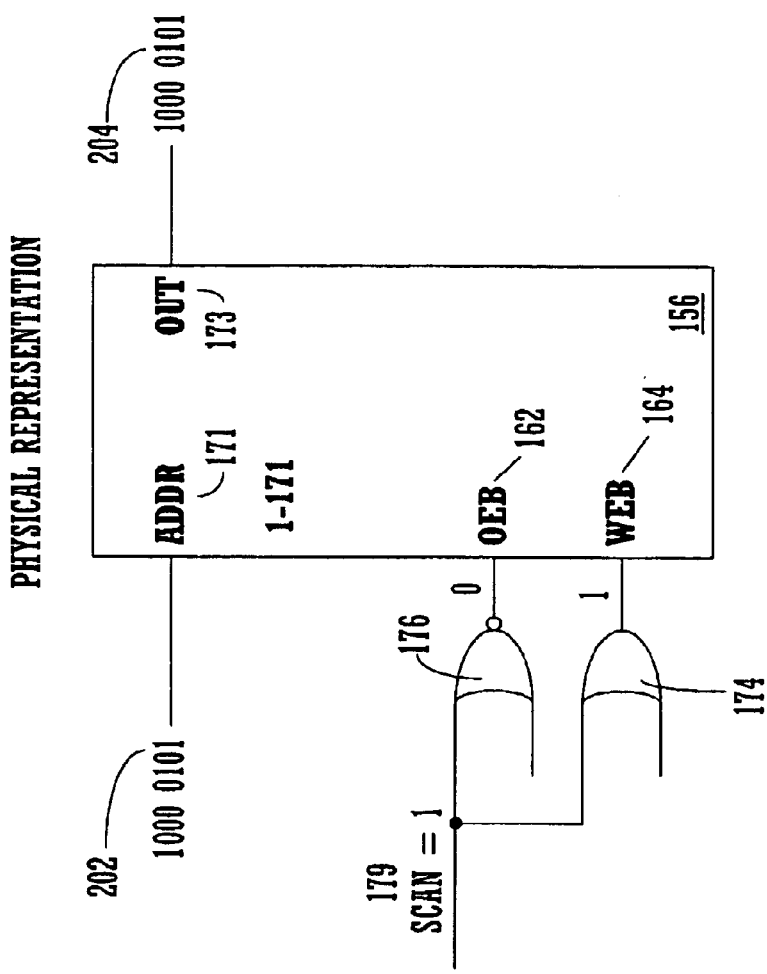
FIG. 2A is an illustration of a physical representation of a memory array with associated data output for a given address input, according to an embodiment of the present invention.
Figure 2B:
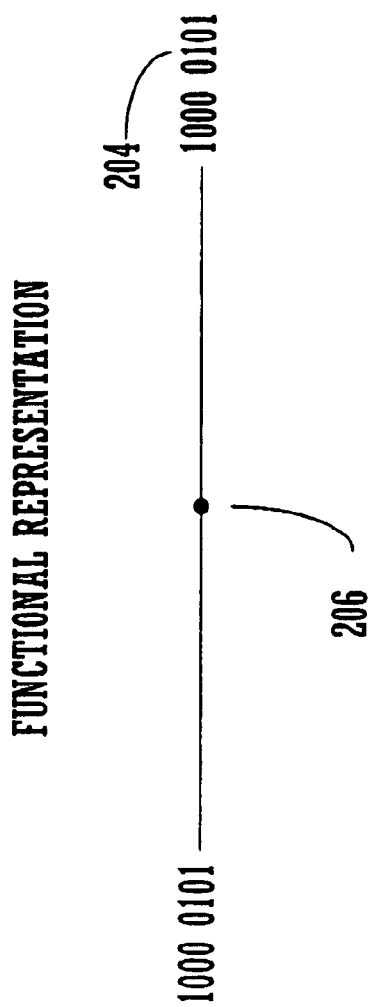
FIG. 2B is an illustration of a functional representation of the memory array of FIG. 2A, according to an embodiment of the present invention.

To allow the memory arrays 156 to be simply incorporated into the circuit 170 schematic, one embodiment of the present invention models the memory arrays 156 as wires. Referring now to FIG. 2A, this is accomplished by first loading each memory location with its address. Then, when testing the circuit 170, the scan line 179 is held high, thus preventing further writing to the memory array 156. However, when an address 202 is input to the array 156, the data 204 at that address is output. Since the two are equal, the address 202 input equals the data 204 output. This effectively causes the memory array 156 to function as a wire 206, as illustrated in FIG. 2B.

Figure 3A:
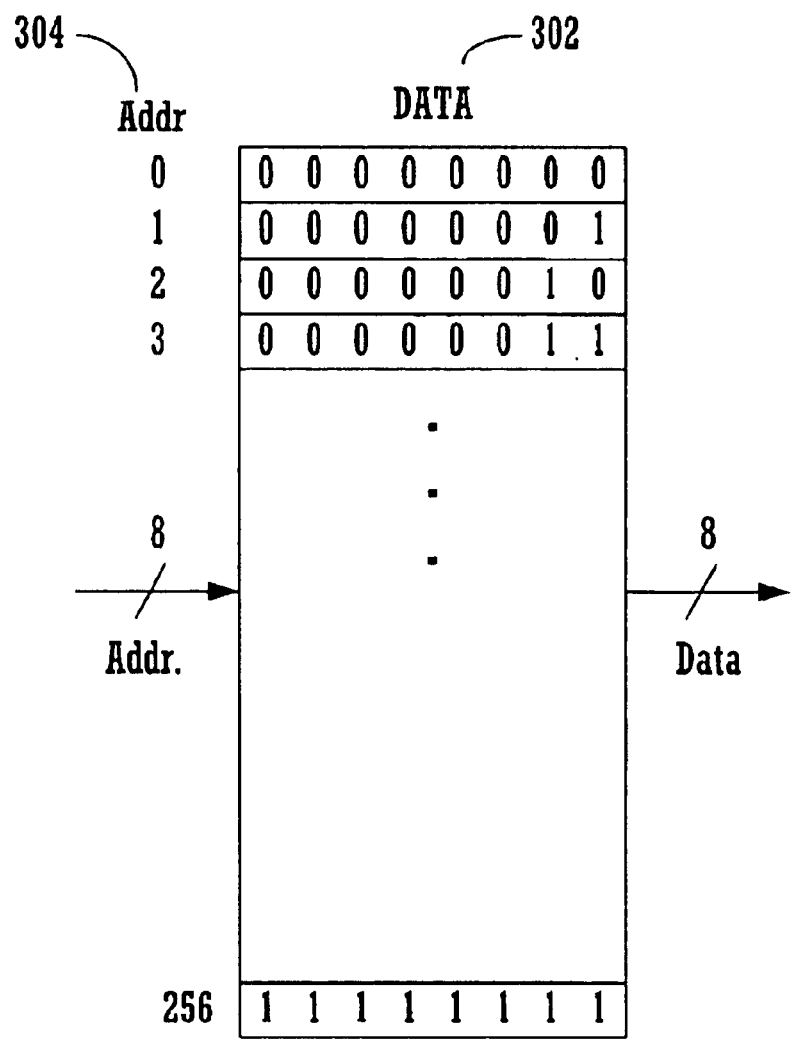
FIG. 3A is an illustration representing exemplary data stored at given address for a case when there are an equal number of address and data lines, according to an embodiment of the present invention.

In some cases, the number of address lines 158 will be equal to the number of data lines 160. Referring to FIG. 3A, an exemplary pattern for loading data 302 is illustrated corresponding to the wire model of FIG. 2A. For example, the data 302 of address zero is zero, the data 302 of address one is one, the data 302 of address 256 is 256, etc. The present invention is well-suited to modeling the arrays 156 in other ways, for example, inverting the address 304, etc.

Figure 3B:
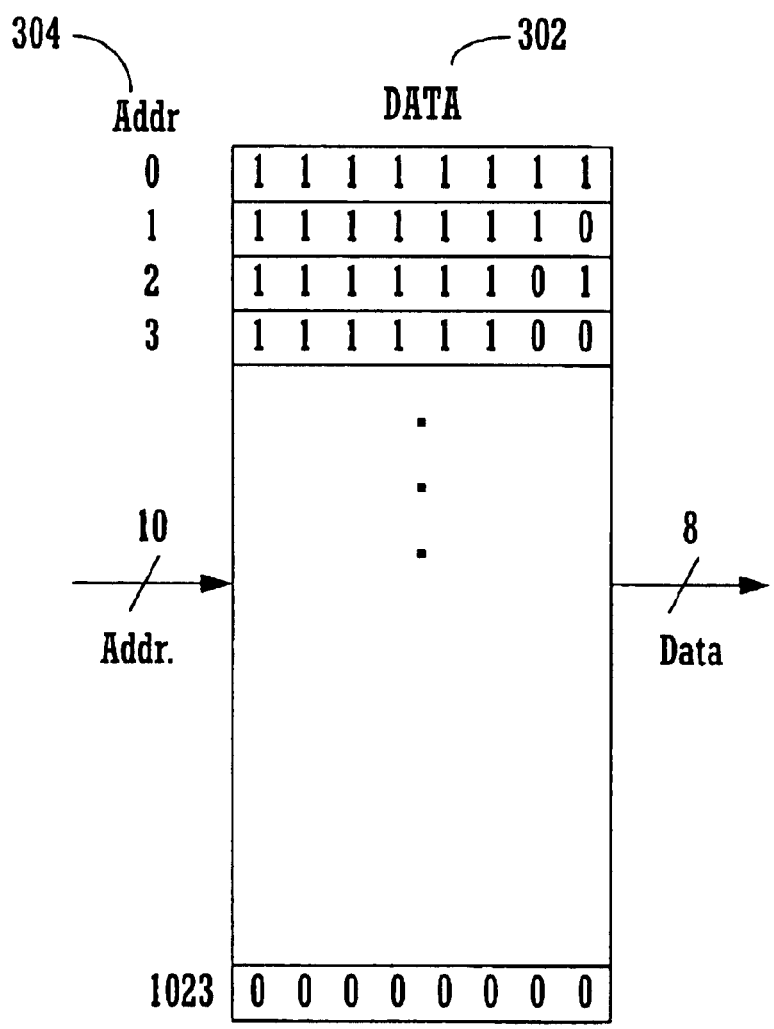
FIG. 3B is an illustration representing exemplary data stored at given address for a case when there are more address lines than data lines, according to an embodiment of the present invention.

In some cases, there will be more address lines 158 than data lines 160. Referring to FIG. 3B, there are ten address lines 158 and eight data lines 160. In this case, the upper two bits of the address 304 may be used to decode the function implemented in the pre-loaded memory array 156. In the example in FIG. 3B the function being implemented is to have the data location store the inverse of its address 304. It is possible, however, to have the function based on the address 304. For example, above address '255,' the function can be different from that below address '256.' The test tool 190 may decode the upper two bits of the address 304 to determine the function which the memory array 156 models.

Figure 3C:
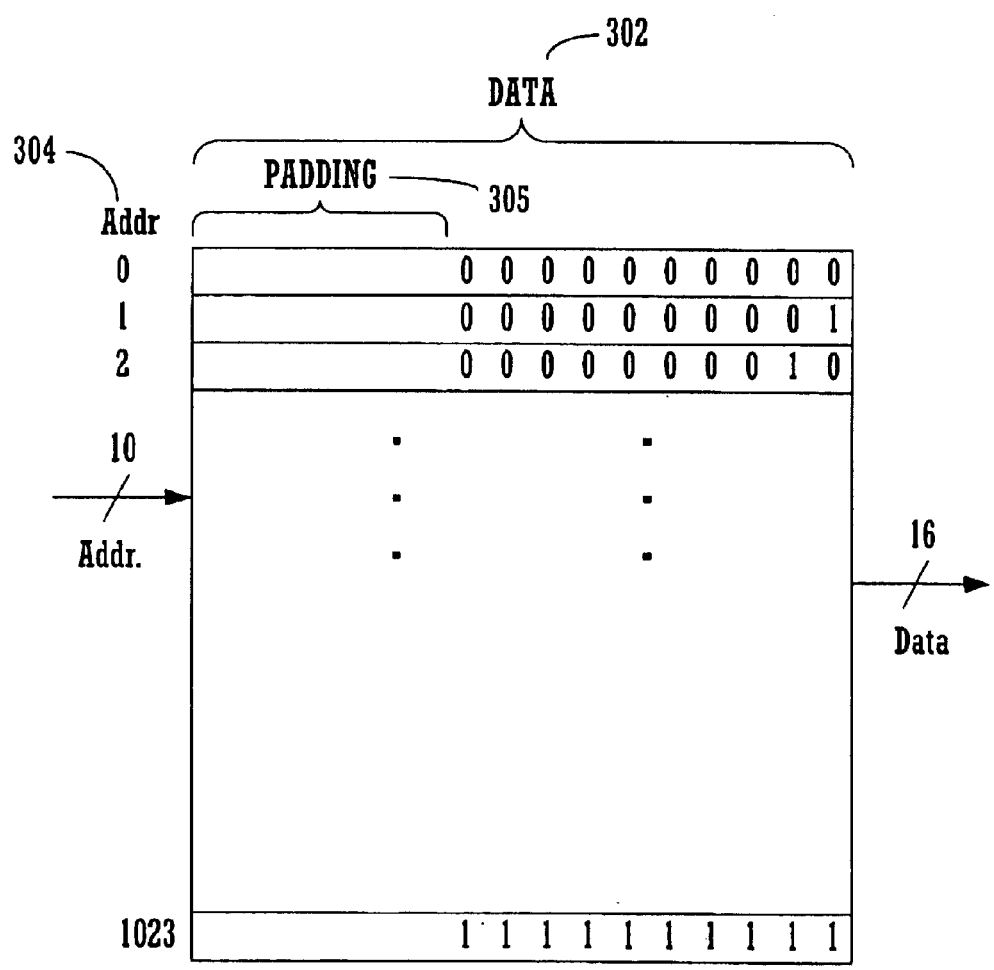
FIG. 3C is an illustration representing exemplary data stored at given address for a case when there are fewer address lines than data lines, according to an embodiment of the present invention.

In a third case, the address bus 158 is narrower than the data bus 160. Referring to FIG. 3C, the upper six bits of data 302 may be padded 305. Any suitable function may be used. For example, the padding 305 may be some function of the address 304. The designer is free to choose suitable values to optimize testing. Furthermore, the data 302 may be modified during the overall testing process.

In one embodiment, the modeling of the memory array 156 is adapted to improve testing of the circuit 170. For example, testing of a number of circuits 170 may reveal that a portion of the circuit 170 is prone to being manufactured with a defect. The values 302 loaded into the memory arrays 156 are chosen such that the defect is more likely to be found. As an example, two circuit lines may frequently short together during the manufacturing process. Suitable choices for data 302 may cause the signal on those lines to be different from each other. Consequently, a defect can be found quickly, thus saving testing time.

Figure 4:
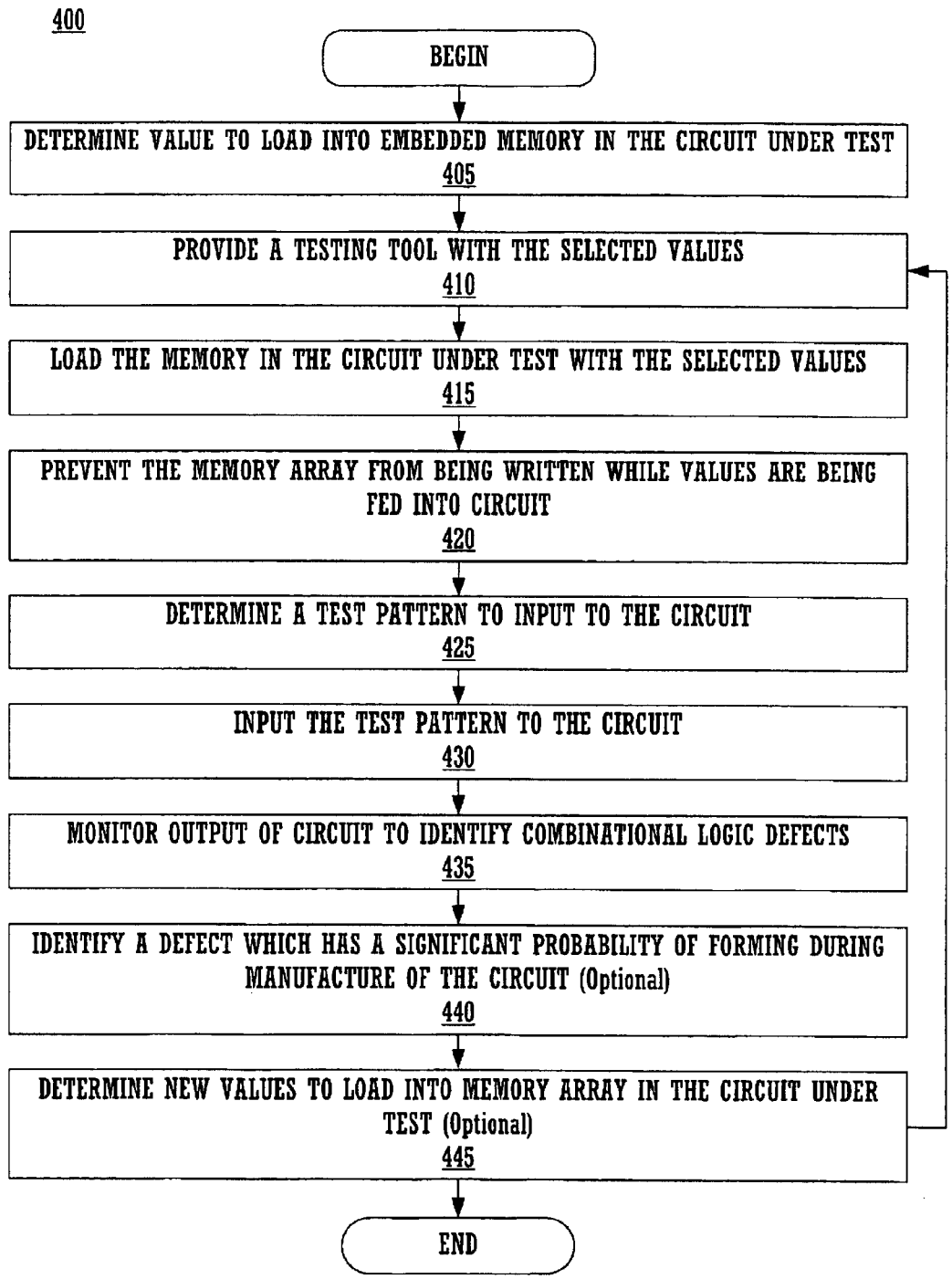
FIG. 4 is a flowchart illustrating the steps of a process of testing a complex digital part containing embedded memory arrays, according to an embodiment of the present invention.

FIG. 4 illustrates the steps of a process of testing the logic 150 of a complex digital circuit 170 containing embedded memory arrays 156. In step 405, the process 400 determines values to load into the memory arrays 156 in the circuit under test 170. The values may be generated by memory modeling logic 180 external to the testing tool 190, by the testing tool 190 itself, etc.

In step 410, the values are provided to a testing tool 190. In one embodiment the values function to model the memory arrays 156. For example, the memory arrays 156 are modeled as wires, such that the testing tool 190 replaces the memory arrays 156 with wires in a schematic of the circuit under test 170. However, the present invention is not limited to modeling the memory arrays 156 as wires.

In step 415, the memory arrays 156 are loaded with selected values. This may be accomplished by inputting the address 304 and data 302 information to the circuit 170. Alternatively, the memory arrays 156 may load known values upon power up.

In step 420, the process 400 prevents the memory arrays 156 from being written to while testing of the logic 150 is undertaken. This prevents the data 302 in the memory arrays 156 from changing during testing, thus assuring the memory arrays 156 output known values. In one embodiment, the testing tool 190 issues a signal 197 to the circuit 190 that indicates that the circuit 170 is under test. This signal 197 is able to prevent the memory arrays 156 from being written to regardless of what signals the logic 150 feeds to the memory arrays 156. If the circuit 170 has a scan mode or test mode pin, this may be conveniently used.

In step 425, the testing tool 190 determines a test pattern 193 or scan vector that is suitable to test the logic 150 of the circuit 170. The testing tool 190 may take into consideration how the memory arrays 156 are modeled and incorporate them into the circuit schematic.

In step 430, the test pattern 193 is input into the circuit under test 170. Because the memory arrays 156 were modeled as a part of the circuit 170, the signals from the scan vectors 193 pass through the memory arrays 156 and allow the testing of logic 150 before and after the memory arrays 156 which is missed by some conventional methods.

In step 435, the testing tool 190 monitors the output of the circuit 170 to determine if there are any defects in the logic 150. Whether the memory arrays 156 were modeled as wires or lookup tables, the test tool 190 knows how the memory arrays 156 will behave, and can thus account for them.

In optional step 440, a defect is identified that has a significant probability of occurring again during the manufacture of the circuit 170. For example, two circuit lines may tend to short together during circuit 170 fabrication.

In optional step 445, the process 400 determines new values for the memory arrays 156 that will lead to a better chance to detect the defect or will likely find the defect will less testing (e.g., fewer scan vector variations). This step may be performed by the testing tool 190 or by the memory modeling logic 180. Then, the process 400 goes back to step 410 or to the end.

Figure 5:
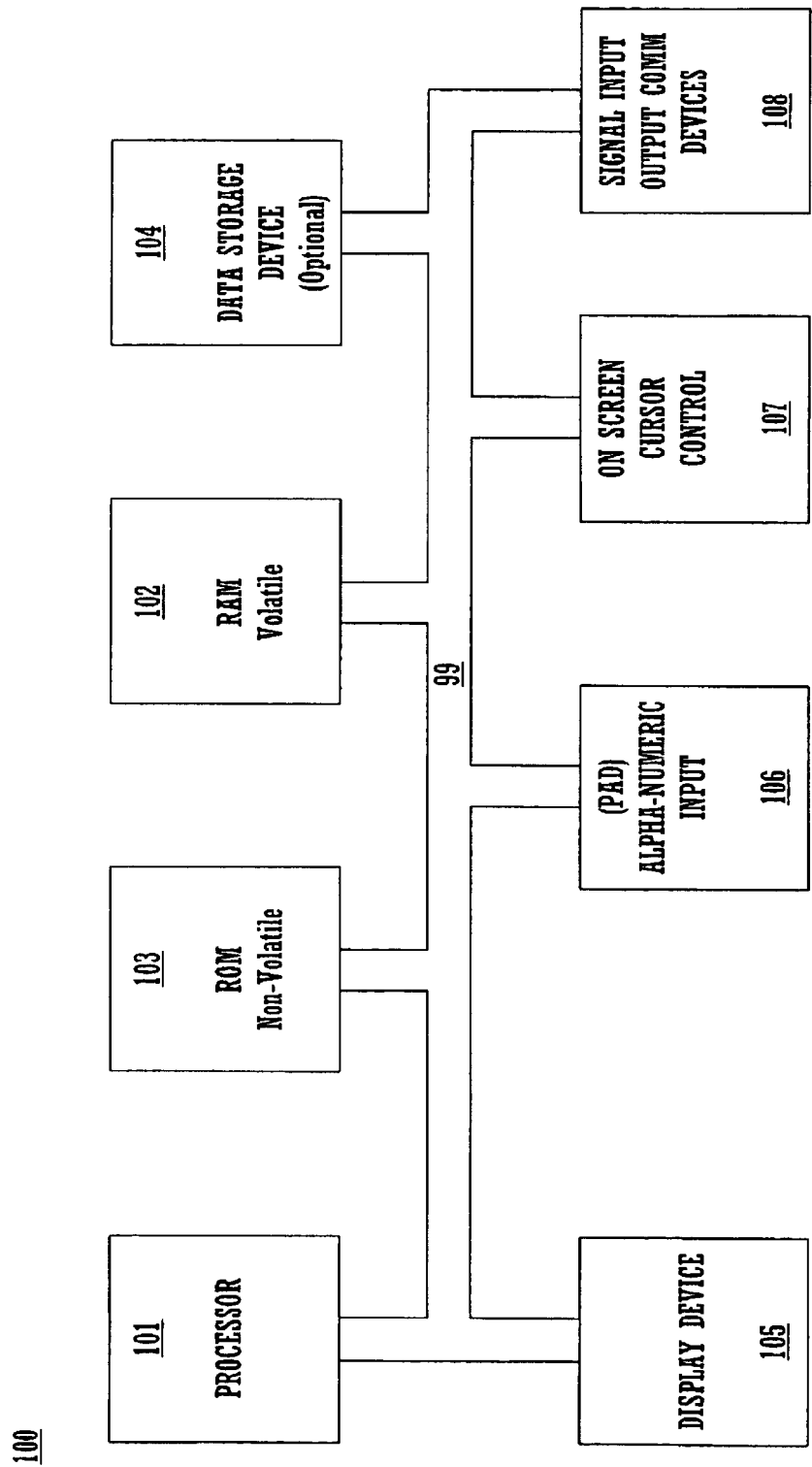
FIG. 5 is a schematic of a computer system, which may be used to implement embodiments of the present invention.

FIG. 5 illustrates circuitry of computer system 100, which may form a platform for a testing tool 190 or the memory array modeling logic 180. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 coupled with the bus 99 for storing information and instructions.

With reference still to FIG. 5, system 100 of the present invention also includes an optional alphanumeric input device 106 including alphanumeric and function keys is coupled to bus 99 for communicating information and command selections to central processor unit 101. System 100 also optionally includes a cursor control device 107 coupled to bus 99 for communicating user input information and command selections to central processor unit 101. System 100 of the present embodiment also includes an optional display device 105 coupled to bus 99 for displaying information. A signal input/output communication device 108 coupled to bus 99 provides communication with external devices.

The preferred embodiment of the present invention a method and system for testing: the logic of a complex digital circuit containing embedded memory arrays is thus described. While the present invention has been described in particular embodiments, it should, be appreciated that the present invention should not be construed as limited by such embodiments, but rather construed according to the below claims.

We claim:

1. A method of testing logic coupled to a memory array in a circuit, comprising the steps of:
   a) loading the memory array with values;
   b) preventing the memory array from being written:
   c) enabling the memory array to output the values at a location when an associated address is input to the memory array;
   d) inputting a test pattern to an element coupled to an input of said memory array while said memory array is prevented from being written and enabled to output the values; and
   e) comparing output of said circuit with expected values given a configuration of said logic, the test pattern, and the values loaded into said memory array, wherein said logic coupled to said memory array is tested.

2. The method of claim 1 wherein output of said memory array is an input to a portion of said logic.

3. The method of claim 1 wherein the output of a portion of said logic is an address input to said memory array.

4. The method of claim 1 wherein said step b) comprises the step of:
   b1) inputting a signal to a path in said circuit which connects to said memory array without passing through said logic.

5. The method of claim 1 wherein said step a) comprises the step of:
   a1) loading the contents at each address of the memory array with the value of the address, wherein the memory array will output the value of the address which is input to the memory array.

6. The method of claim 1 wherein said step a) comprises the step of:
   a1) loading the contents at each address of the memory array with the inverse of the value of the address.

7. The method of claim 1 further comprising the steps of:
   f) allowing the memory array to be written;
   g) loading the memory array with values that are different from those of said step a); and
   h) preventing the memory array from being written.

8. The method of claim 1 wherein said step a) comprises the steps of:
   a1) determining a mapping between each address of the memory array and a value to be stored at that address; and
   a2) storing each said value in the memory array at an appropriate address.

9. The method of claim 1 further comprising the steps of:
   f) identifying a defect that has a significant probability of forming during manufacture of said circuit; and
   g) determining values to be loaded into the memory array to increase the probability that said defect is detected.

10. The method of claim 1 wherein said step a) comprises the step of:
    a1) providing power to said circuit wherein said memory array loads said values.

11. The method of claim 1 wherein said memory array is random access memory (RAM).

12. A method of testing logic coupled to memory in of a circuit comprising the steps of:
    a) creating a model for the memory in said circuit;
    b) loading the memory with data representing said model;
    c) generating a test pattern for said circuit based upon the model of said memory and the logic coupled to said memory;

d) inhibiting said memory from being written;

e) enabling said memory to output said data;

f) inputting said test pattern to said circuit while said memory is inhibited from being written and enabled to output said data; and g) analyzing output of said circuit, wherein said logic coupled to the memory is tested.

13. The method of claim 12 wherein said step a) comprises the step of:

a1) modeling said memory as a wire.

14. The method of claim 12 wherein said step a) comprises the step of:

a1) modeling said memory as a lookup table.

15. The method of claim 12 wherein said step c) comprises the step of:

c1) providing said model of said memory to a test pattern generation tool.

16. The method of claim 12 wherein said step a) comprises the step of:

a1) for every address of said memory, determining a value which is a function of the address.

17. The method of claim 12 further comprising the step of:

h) creating a new model for said memory based upon said step g).

18. The method of claim 12 further comprising the step of:

h) using the value of selected address bits, decoding the modeling of said memory.

* * * * *